(12) United States Patent
Lee et al.

(10) Patent No.: US 11,127,922 B2
(45) Date of Patent: Sep. 21, 2021

(54) DISPLAY DEVICE

(71) Applicant: SAMSUNG DISPLAY CO., LTD., Yongin-si (KR)

(72) Inventors: Seung Jae Lee, Seoul (KR); Han Soo Kim, Asan-si (KR); Kyung Min Park, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/556,082

(22) Filed: Aug. 29, 2019

(65) Prior Publication Data

US 2020/0287159 A1 Sep. 10, 2020

(30) Foreign Application Priority Data

Mar. 6, 2019 (KR) .......................... 10-2019-0025905

(51) Int. Cl.
*H01L 27/32* (2006.01)
*H01L 51/52* (2006.01)
*H01L 27/12* (2006.01)

(52) U.S. Cl.
CPC ...... *H01L 51/5246* (2013.01); *H01L 27/3248* (2013.01); *H01L 27/3262* (2013.01);
(Continued)

(58) Field of Classification Search
CPC ............. H01L 51/5246; H01L 27/3276; H01L 27/124

See application file for complete search history.

(56) References Cited

U.S. PATENT DOCUMENTS 7,431,628 B2 10/2008 Park et al.
2007/0087130 A1* 4/2007 Arai ...................... C23C 14/246
427/457

(Continued)

FOREIGN PATENT DOCUMENTS

KR 10-2011-0019498 A 2/2011
KR 10-1463650 11/2014

(Continued)

OTHER PUBLICATIONS

Joe Teh, "OPPO Launches the OPPO R17 and R17 Pro," Techielobang, https://techielobang.com/blog/2018/08/30/oppo-launches-the-oppo-r17-and-r17-pro, Aug. 30, 2018, 9 pages.

(Continued)

*Primary Examiner* — Michele Fan
(74) *Attorney, Agent, or Firm* — Lewis Roca Rothgerber Christie LLP

(57) ABSTRACT

A display device includes a first substrate including a display area and a non-display area around the display area; a pad portion at an end part of the first substrate in the non-display area; a power voltage transmitting line electrically connected to the pad portion and surrounding at least part of the display area; a second substrate facing the first substrate; and a sealant between the first substrate and the second substrate and surrounding the display area. In the end part, the power voltage transmitting line includes a first portion overlapping the sealant and extending in a first direction and a second portion not overlapping the sealant, and the second portion includes a first protrusion protruded from the first portion in a second direction crossing the first direction, and a second protrusion protruded in a direction opposite to the second direction.

9 Claims, 10 Drawing Sheets

(52) U.S. Cl.
CPC ........ *H01L 27/3276* (2013.01); *H01L 27/124* (2013.01); *H01L 27/323* (2013.01)

(56) References Cited

U.S. PATENT DOCUMENTS

| | | | | |
|---|---|---|---|---|
| 2011/0116019 | A1* | 5/2011 | Hwang | G02F 1/13452 349/84 |
| 2011/0291119 | A1* | 12/2011 | Ryu | H01L 51/524 257/88 |
| 2012/0154720 | A1* | 6/2012 | Park | G02F 1/13394 349/104 |
| 2016/0104757 | A1* | 4/2016 | Kim | H01L 27/1255 257/40 |
| 2018/0122836 | A1* | 5/2018 | Kang | H01L 33/502 |
| 2020/0310209 | A1* | 10/2020 | Okuyama | G02F 1/136286 |

FOREIGN PATENT DOCUMENTS

| | | |
|---|---|---|
| KR | 10-2016-0013471 A | 2/2016 |
| KR | 10-1781506 | 9/2017 |

OTHER PUBLICATIONS

Baidu, "OPPO R17 new listing, shiny, appearance, such price, netizen: how so expensive?," https://baijiahao.baidu.com/s?id=1610231769788665633&wfr=spider&for=pc, Aug. 30, 2018, 5 pages.

Baidu, "V11 Pro is sold abroad for the first time today: price, specifications," https://baijiahao.baidu.com/s?id=1611382213979120221&wfr=spider&for=pc, Sep. 12, 2018, 4 pages.

Hansa Verma, et al., "Vivo V11 Pro India launch Highlights: V11 Pro sale on Sep. 12, here is the price," https://indianexpress.com/article/technology/mobile-tabs/vivo-v11-pro-india-launch-live-updates-hiahlights/, Sep. 7, 2018, 13 pages.

Pacific Internet, "When is the Vivo X23 listed? Officially released on Sep. 14th, 3498 yuan," Baidu, https://baijiahao.baidu.com/s?id=1610917759525345515&wfr=spider&for=pc&sa=vs_ob_realtime, Sep. 7, 2018, 13 pages.

Technologist Expert, Vivo X23 (2018), Features & More!, http://technologistexpert.com/vivo-x23-2018features/, Sep. 12, 2018, 3 pages.

Gsmarena, "vivo X23 is official with in-display fingerprint scanner and Snapdragon 670," https://www.gsmarena.com/vivo_x23_is_official_with_indisplay_fingerprint_scanner_and_snapdragon_670-news-33140.php, Sep. 6, 2018, 3 pages.

CNMO Mobile China, "Glory Magic2 will launch 9 black technology in full swing tomorrow," Baidu, https://baijiahao.baidu.com/s?id=1616299105859132970&wfr=spider&for=pc, Nov. 5, 2018, 6 pages.

Zhao Yue, "OPPO RX17 Pro, RX17 Neo Europe will release corresponding to domestic R17 Pro, R15x," https://www.yezi.cn/2018/1110/14119.shtml, Nov. 10, 2018, 7 pages.

* cited by examiner

70a

70b

DISPLAY DEVICE

CROSS-REFERENCE TO RELATED APPLICATION

This application claims priority to and the benefit of Korean Patent Application No. 10-2019-0025905, filed on Mar. 6, 2019 in the Korean Intellectual Property Office, the entire content of which is incorporated herein by reference.

BACKGROUND

1. Field

Aspects of embodiments of the present disclosure relate to a display device.

2. Description of the Related Art

An emissive display device may be fabricated by forming light emitting elements on a substrate and circuit elements to drive the light emitting elements. Because the light emitting elements are vulnerable to moisture or oxygen, the display device may have an encapsulation structure to prevent or substantially prevent moisture or oxygen from penetrating from the outside so that the light emitting elements are not damaged. As an encapsulation method with high airtightness, a technique in which a frit is disposed between the substrate on which light emitting elements are formed and the encapsulating substrate and a laser is irradiated to the frit to combine the substrate and the encapsulating substrate by the melted and cured frit (a sealant) may be used.

In the display device, most of a region may be a display area forming a screen; however, a certain region of the display device, for example, an edge region, may be a non-display area in which a driving circuit, a voltage line, a signal line, and the like are disposed. Typically, the non-display area of the display device is constrained to increase a screen-to-body ratio of the display device.

The above information disclosed in this Background section is only for enhancement of understanding of the background and, therefore, it may contain information that does not form the prior art that is already known in this country to a person of ordinary skill in the art.

SUMMARY

According to an aspect of embodiments of the present disclosure, a display device has improved reliability while reducing the non-display area.

A display device according to one or more embodiments includes: a first substrate including a display area and a non-display area around the display area; a pad portion at an end part of the first substrate in the non-display area; a power voltage transmitting line electrically connected to the pad portion and surrounding at least part of the display area; a second substrate facing the first substrate; and a sealant between the first substrate and the second substrate and surrounding the display area. In the end part, the power voltage transmitting line includes a first portion overlapping the sealant and extending in a first direction, and a second portion not overlapping the sealant, and the second portion includes a first protrusion protruded from the first portion in a second direction crossing the first direction, and a second protrusion protruded in a direction opposite to the second direction.

The first protrusion and the second protrusion each may respectively extend in the first direction, and the first protrusion and the second protrusion each may have a length in the first direction that is larger than a width in the second direction.

The first protrusion and the second protrusion may include a part that does not overlap the pad portion in the second direction.

The power voltage transmitting line may further include a third part extending from the end part in the second direction, and connected to at least one pad of the pad portion.

At least one of the first protrusion and the second protrusion may include a part of which a width is varied along the first direction.

The second protrusion may include a part of which a width decreases along the first direction and then increases.

The first portion may have a non-uniform thickness, and the second portion may have a uniform thickness.

The display device may further include a light emitting element in the display area, and the power voltage transmitting line may be a common voltage transmitting line that is electrically connected to a common electrode of the light emitting element.

The display device may further include a transistor in the display area and connected to a pixel electrode of the light emitting element, and the common voltage transmitting line may be arranged as a same layer as source and drain electrodes of the transistor, or as a same layer as a gate electrode of the transistor.

A display device according to one or more embodiments includes: a first substrate including a display area and a non-display area around the display area; a light emitting element in the display area and including a pixel electrode, a light emission member, and a common electrode; a common voltage transmitting line in the non-display area and electrically connected to the common electrode; a second substrate overlapping the first substrate; and a sealant between the first substrate and the second substrate and surrounding the display area. The common voltage transmitting line may include a first portion overlapping the sealant and a second portion not overlapping the sealant, and in an end part of the first substrate, the second portion may include a first protrusion that is closer to the display area than the sealant and a second protrusion that is farther from the display area than the sealant.

At least one of the first protrusion and the second protrusion may extend in a first direction, and at least one of the first protrusion and the second protrusion may have a length in the first direction that is larger than a width in a second direction crossing the first direction.

The display device may further include a pad portion including pads arranged in the first direction along an edge of the first substrate, and the first protrusion and the second protrusion may include a part that does not overlap the pad portion in the second direction.

The common voltage transmitting line may further include a third portion extending in the second direction and in contact with at least one pad of the pad portion.

At least one of the first protrusion and the second protrusion may include a part of which a width varies along the first direction.

The second protrusion may include a part of which a width decreases along the first direction and then increases.

The first portion may have a non-uniform thickness, and the second portion may have a uniform thickness.

The display device may further include a connecting member electrically connecting the common voltage transmitting line and the common electrode of the light emitting element.

The display device may further include a transistor in the display area and connected to the pixel electrode of the light emitting element, and the common voltage transmitting line may be arranged as a same layer as source and drain electrodes of the transistor.

An upper surface of the first portion may be in contact with the sealant.

According to embodiments, a non-display area of a display device may be reduced, and resistance of power wiring may be reduced. Accordingly, display quality may be improved, and a margin of a power voltage transmitted through the power wiring may be reduced, thereby reducing power consumption.

DETAILED DESCRIPTION

Figure 1:
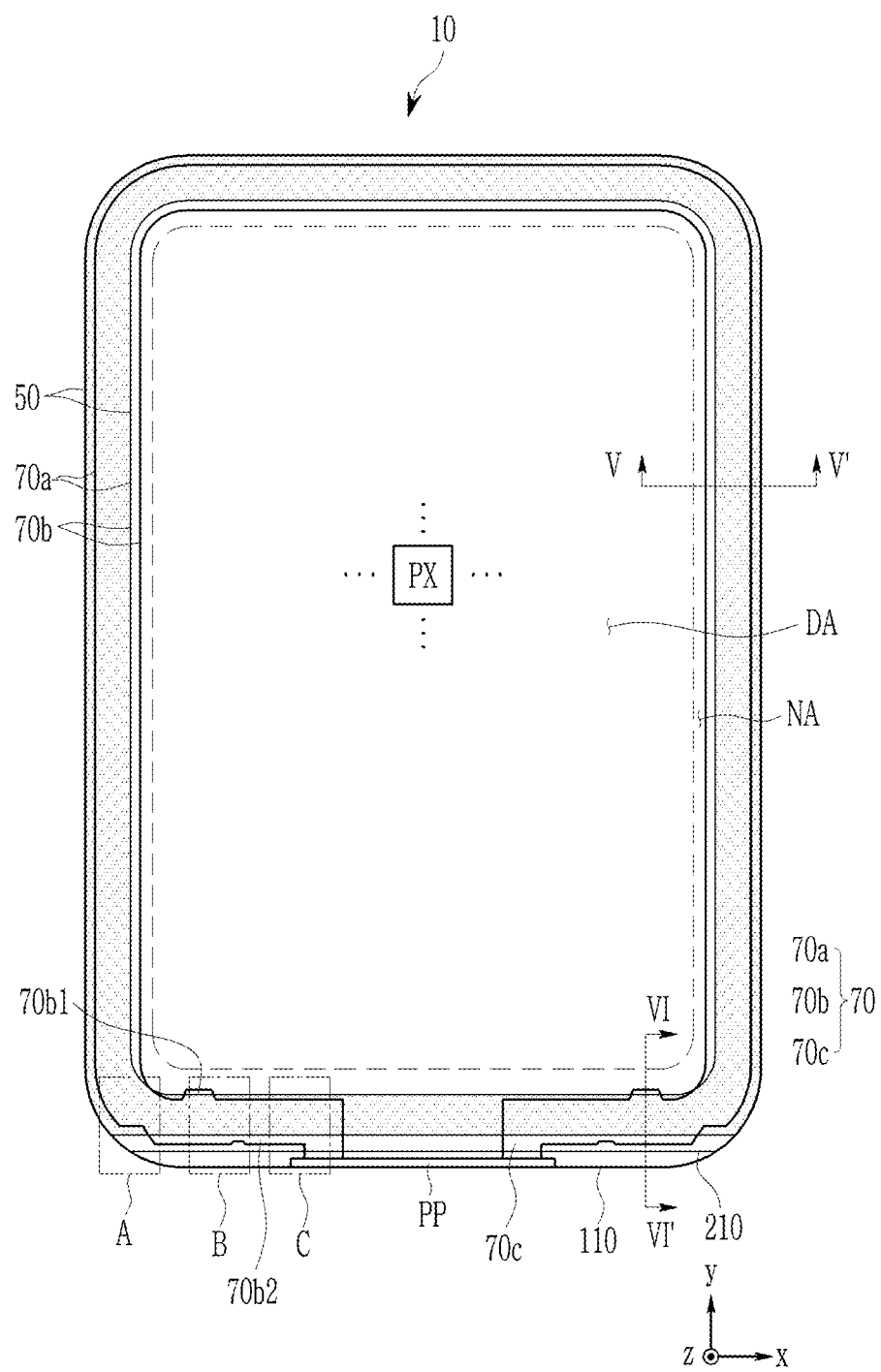
FIG. 1 is a layout view schematically showing a display device according to an embodiment.

The inventive concept will be described more fully herein with reference to the accompanying drawings, in which some example embodiments are shown. As those skilled in the art would realize, the described embodiments may be modified in various different ways, all without departing from the spirit or scope of the inventive concept.

In order to clearly illustrate the inventive concept, parts that are not related to the description may be omitted, and the same or similar constituent elements are given the same reference numerals throughout the specification.

The size and thickness of components and configurations shown in the drawings may be arbitrarily shown for convenience of explanation, and, thus, the inventive concept is not limited to that illustrated. In the drawings, the thickness of layers, films, panels, regions, etc., may be exaggerated for clarity.

It is to be understood that when an element such as a layer, film, region, or substrate is referred to as being "on" another element, it may be directly on the other element or one or more intervening elements may also be present. In contrast, when an element is referred to as being "directly on" another element, there are no intervening elements present.

In addition, unless explicitly described to the contrary, the word "comprise" and variations, such as "comprises" or "comprising," will be understood to imply the inclusion of stated elements but not the exclusion of any other elements.

In the drawings, a symbol "x" is used to indicate a first direction, a symbol "y" is used to indicate a second direction perpendicular to the first direction, and a symbol "z" is used to indicate a third direction perpendicular to the first direction and the second direction. The first direction "x," the second direction "y," and the third direction "z" may correspond to a horizontal direction, a vertical direction, and a thickness direction of the display device, respectively.

Unless otherwise specified throughout the specification, "overlap" means an overlap in a plan view and means an overlap in the third direction "z."

"And/or" includes all combinations of one or more of the referenced components.

It is to be understood that the terms "first" and "second" are used herein to describe various components but these components should not be limited by these terms. The above terms are used to distinguish one component from another. For example, a first component may be referred to as a second component and vice versa without departing from the scope of the inventive concept. Singular expressions include plural expressions unless the context clearly dictates otherwise.

In addition, terms such as "below," "the lower side," "on," and "the upper side" are used to describe a relationship of configurations shown in the drawing. The terms are described as a relative concept based on a direction shown in the drawing. It is to be understood that the spatially relative terms are intended to encompass different orientations of the device in use or operation in addition to the orientation depicted in the figures.

Unless otherwise defined, all terms (including technical and scientific terms) used herein have the same meaning as terms commonly understood by those skilled in the art to which this invention belongs. Also, terms such as terms defined in commonly used dictionaries should be interpreted as having meaning consistent with meaning in the context of the related art, and unless the term is interpreted in an ideal or overly formal sense, they are explicitly defined here.

An emissive display device is exemplified as a display device according to embodiments with reference to the accompanying drawings.

Figure 2:
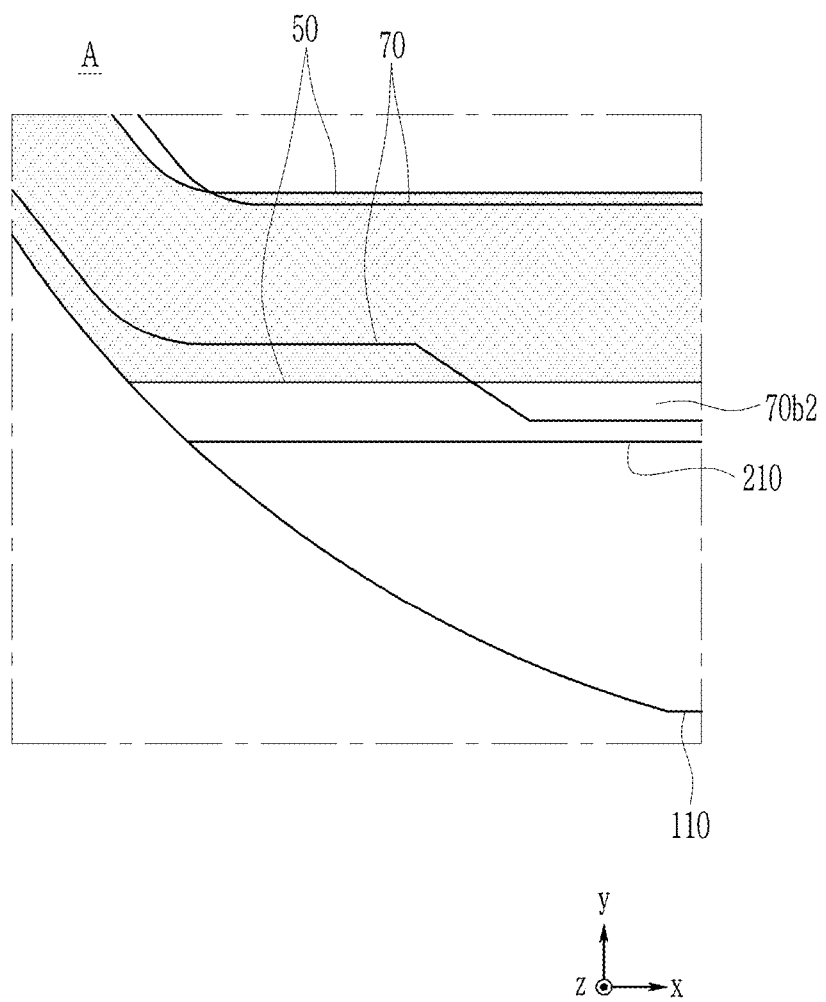
FIG. 2 is an enlarged view of a region "A" in FIG. 1 according to an embodiment.
Figure 3:
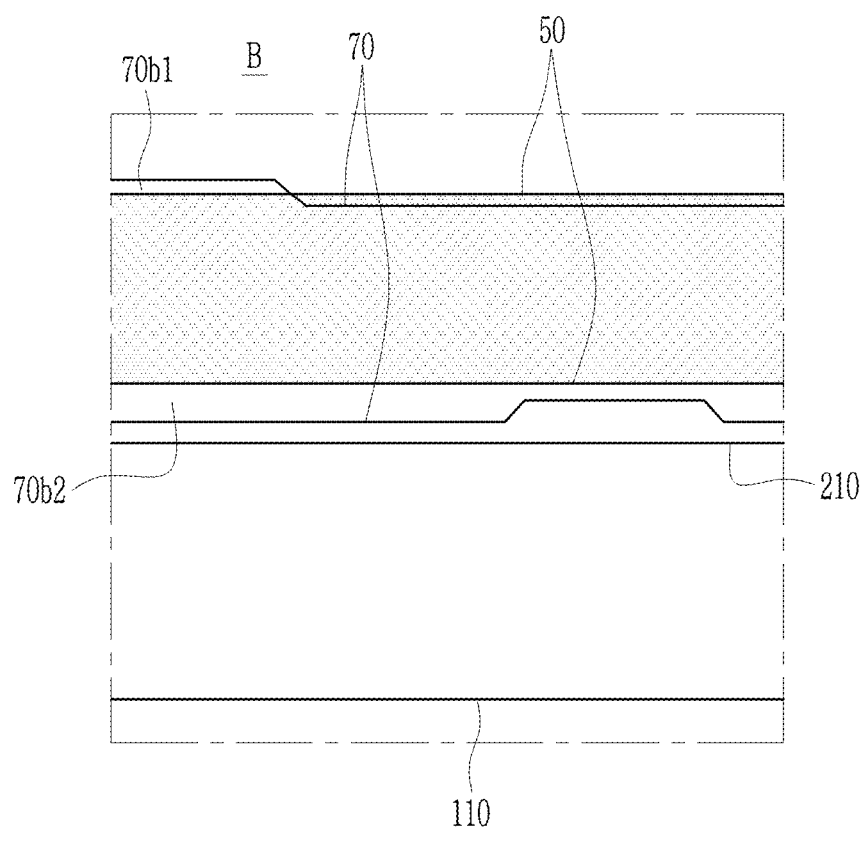
FIG. 3 is an enlarged view of a region "B" in FIG. 1 according to an embodiment.
Figure 4:
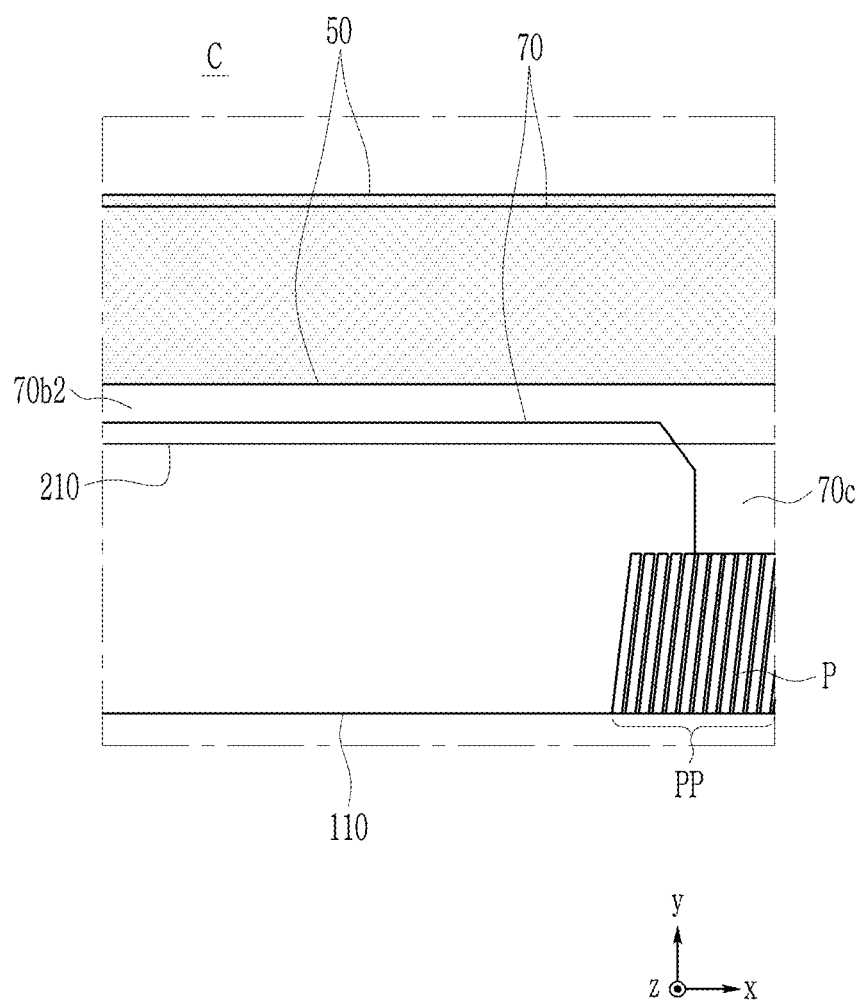
FIG. 4 is an enlarged view of a region "C" in FIG. 1 according to an embodiment.

FIG. 1 is a layout view schematically showing a display device according to an embodiment; FIG. 2 is an enlarged view of a region "A" in FIG. 1 according to an embodiment; FIG. 3 is an enlarged view of a region "B" in FIG. 1 according to an embodiment; and FIG. 4 is an enlarged view of a region "C" in FIG. 1 according to an embodiment.

Referring to FIG. 1, a display device 10 according to an embodiment includes a display area DA (referred to as an active region) to display an image and a non-display area NA (referred to as a peripheral area) around the display area DA. In the non-display area NA, elements and/or wires for generating and/or transmitting several signals applied to the display area DA may be disposed. In FIG. 1, an inside and an outside of a quadrangular dotted line correspond to the display area DA and the non-display area NA, respectively.

In the display area DA, pixels PX on a first substrate 110 may be disposed in a matrix form. Each pixel PX may include a light emitting element, which may be a light emitting diode LED. In the display area DA, signal lines, such as scan lines (also referred to as gate lines), emission control lines, and data lines, may be disposed on the first substrate 110. The scan line, the emission control line, and the data line may be connected to each pixel PX, and each pixel PX may receive a scan signal (referred to as a gate signal), an emission control signal, and a data signal from these signal lines. In the display area DA, driving voltage lines transmitting a driving voltage (ELVDD) to the pixels PX may be disposed on the first substrate 110.

In the non-display area NA, a pad portion PP where pads for receiving signals from the outside of the display device 10 are arranged in an approximate first direction "x" may be disposed on the first substrate 110. In the non-display area NA, parts disposed at the upper side, the lower side, the left side, and the right side of the display area DA are respectively referred to as an upper end part, a lower end part, a left end part, and a right end part of the display device 10 or the first substrate 110, and individually each may be referred to as one end part. In the non-display area NA, the parts between the upper end part and the left end part, between the upper end part and the right end part, between the lower end part and the left end part, and between the lower end part and the right end part may be referred to as corner parts. The pad portion PP may be disposed along the edge of the lower end part of the display device 10. The pads of the pad portion PP may be connected to the wires disposed in the non-display area NA. A flexible printed circuit film for transmitting the signals and the voltages from the outside may be bonded to the pad portion PP. In an embodiment, three edges (the upper side, the left side, and the right side) of the first substrate 110 may be aligned with three edges of a second substrate 210 on a plane, and so as to expose the pad portion PP to the outside for the bonding of the flexible printed circuit film, the first substrate 110 may be longer than the second substrate 210 in the region where at least the pad portion PP is disposed.

A driving device that generates and/or processes the various signals to drive the pixels PX of the display area DA may be disposed in the non-display area NA, and may be placed in a flexible printed circuit film bonded to the pad portion PP. The driving device may include a data driver applying a data signal to the data line, a gate driver applying a gate signal (referred to as a scan signal) to the gate line, and a signal controller controlling the data driver and the gate driver. In an embodiment, the gate driver may be integrated in the non-display area NA.

In the non-display area NA, a common voltage transmitting line 70 to transmit a common voltage (ELVSS) to the pixels PX may be disposed. The common voltage (ELVSS) and the driving voltage (ELVDD) are power voltages applied to the pixels PX. The common voltage (ELVSS) may be lower than the driving voltage (ELVDD). For example, the common voltage (ELVSS) may be a negative voltage and the driving voltage (ELVDD) may be a positive voltage. The common voltage transmitting line 70 corresponds to the power voltage transmitting line. The common voltage transmitting line 70 may receive the voltage of a level (e.g., a predetermined level) through the pad portion PP to be applied to the common electrode of the pixels PX.

In an embodiment, one end and the other end of the common voltage transmitting line 70 may be electrically connected to the pad portion PP, and may be formed to enclose or surround at least part of the display area DA. The common voltage transmitting line 70 may include portions extending in or approximately in the first direction "x" and portions extending in or approximately in the second direction "y." The common voltage transmitting line 70 may extend or approximately extend in the first direction "x" in the upper end part and the lower end part of the display device 10, and may extend or approximately extend in the second direction "y" in the left end part and the right end part of the display device 10. In the lower end part of the display device 10, a width of the common voltage transmitting line 70 may vary rather than being constant. Here, the width of the common voltage transmitting line 70 means a distance between both ends of the common voltage transmitting line 70 in the direction perpendicular to the extending direction of the common voltage transmitting line 70. In an embodiment, the common voltage transmitting line 70 may be formed to be approximately symmetrical based on a center line of the display device 10 in the second direction "y."

A sealant 50 is disposed in the non-display area NA. In an embodiment, the sealant 50 is formed to completely surround the display area DA. In an embodiment, the sealant 50 may be disposed up to the upper edge, the left edge, and the right edge of the second substrate 210, and slightly away from the lower edge of the second substrate 210. If the sealant 50 reaches the lower edge, it may be difficult to cut the second substrate 210 shorter than the first substrate 110. The sealant 50 may bond the first substrate 110 and the second substrate 210, and prevent or substantially prevent impurities, such as moisture and oxygen, from penetrating the first substrate 110 and the second substrate 210 from the outside. The display area DA may be air-tightly sealed by the first substrate 110, the second substrate 210, and the sealant 50 therebetween. The sealant 50 may be formed in a quadrangular or approximately quadrangular form as a whole, and the sealant 50 may be formed with a curved line at four corner parts. In an embodiment, the portion of the sealant 50 extending in a straight line may be formed with a constant thickness.

To describe the relationship of the common voltage transmitting line 70 and the sealant 50, the common voltage transmitting line 70 includes a first portion 70a overlapping the sealant 50 and a second portion 70b that does not overlap the sealant 50. The first portion 70a and the second portion 70b may be formed continuously without being physically separated. Thus, by forming the common voltage transmitting line 70 and the sealant 50 to be overlapped with each other, the width of the non-display area NA may be reduced. If the common voltage transmitting line 70 is formed to partially or completely overlap the sealant 50, the width of the non-display area NA may be reduced. However, as the second portion 70b of the common voltage transmitting line 70 which does not overlap the sealant 50 decreases, the resistance of the common voltage transmitting line 70 may increase. The reason is described later. Due to the voltage drop due to the increase in resistance, the level of the common voltage (ELVSS) supplied to the display area DA may not be uniform and may lead to an image quality deterioration such as luminance non-uniformity. In order to compensate for this, the common voltage (ELVSS) of a lower level is supplied, which may increase the power consumption.

For connection with the pads of the pad portion PP in the lower end part of the display device 10, the common voltage transmitting line 70 may include a third portion 70c extending in the second direction "y." In an embodiment, a portion of the third portion 70c may not overlap the sealant 50, and a portion of the third portion 70c may overlap the sealant 50. The third portion 70c may overlap the pad portion PP in the second direction "y."

Since the common voltage transmitting line 70 includes the second portion 70b that does not overlap the sealant 50, the resistance increase of the common voltage transmitting line 70 may be reduced while reducing the width of the non-display area NA. In the upper end part, the left end part, and the right end part of the display device 10, the second portion 70b may be disposed inside the sealant 50, that is, closer to the display area DA than the sealant 50.

Referring to FIG. 1 to FIG. 4, in the lower end part of the display device 10, the second portion 70b may include a first protrusion 70b1 disposed inside the sealant 50 and a second protrusion 70b2 disposed outside the sealant 50. In other words, the first protrusion 70b1 may be disposed closer to the display area DA than the sealant 50, and the second protrusion 70b2 may be disposed farther away from the display area DA than the sealant 50. The first protrusion 70b1 may be protruded from the first portion 70a in the second direction "y," and the second protrusion 70b2 may be protruded from the first portion 70a in a direction opposite to the second direction "y." At the lower end part of the display device 10, in the common voltage transmitting line 70, the first portion 70a may be extended or approximately extended in the first direction "x" while overlapping the sealant 50, and the second portion 70b may be protruded from the first portion 70a without overlapping the sealant 50 in the second direction "y" and/or the opposite direction thereto.

The first protrusion 70b1 and the second protrusion 70b2 of the second portion 70b may be elongated in the first direction "x," respectively. In an embodiment, a length of the first protrusion 70b1 and/or the second protrusion 70b2 in the first direction "x" may be larger than the width in the second direction "y." The first protrusion 70b1 and/or the second protrusion 70b2 may include a part of which the width varies along the first direction "x." In an embodiment, the first protrusion 70b1 and/or the second protrusion 70b2 may include a portion of which the width decreases along the first direction "x" and then increases. In an embodiment, the first protrusion 70b1 and/or the second protrusion 70b2 may include a portion of which the width increases along the first direction "x" and then decreases. The first protrusion 70b1 and the second protrusion 70b2 may be positioned such that they do not interfere (e.g., short) with other wires and circuits in the lower end part of display device 10. The first protrusion 70b1 and the second protrusion 70b2 may include a portion that does not overlap the pad portion PP in the second direction "y."

The third portion 70c of the common voltage transmitting line 70 may extend in the second direction "y" or the opposite direction thereto, and the third portion 70c may be in contact with at least one pad P of the pad portion PP.

A cross-sectional structure of the display device 10 according to an embodiment will now be described with reference to FIG. 5 and FIG. 6.

Figure 5:
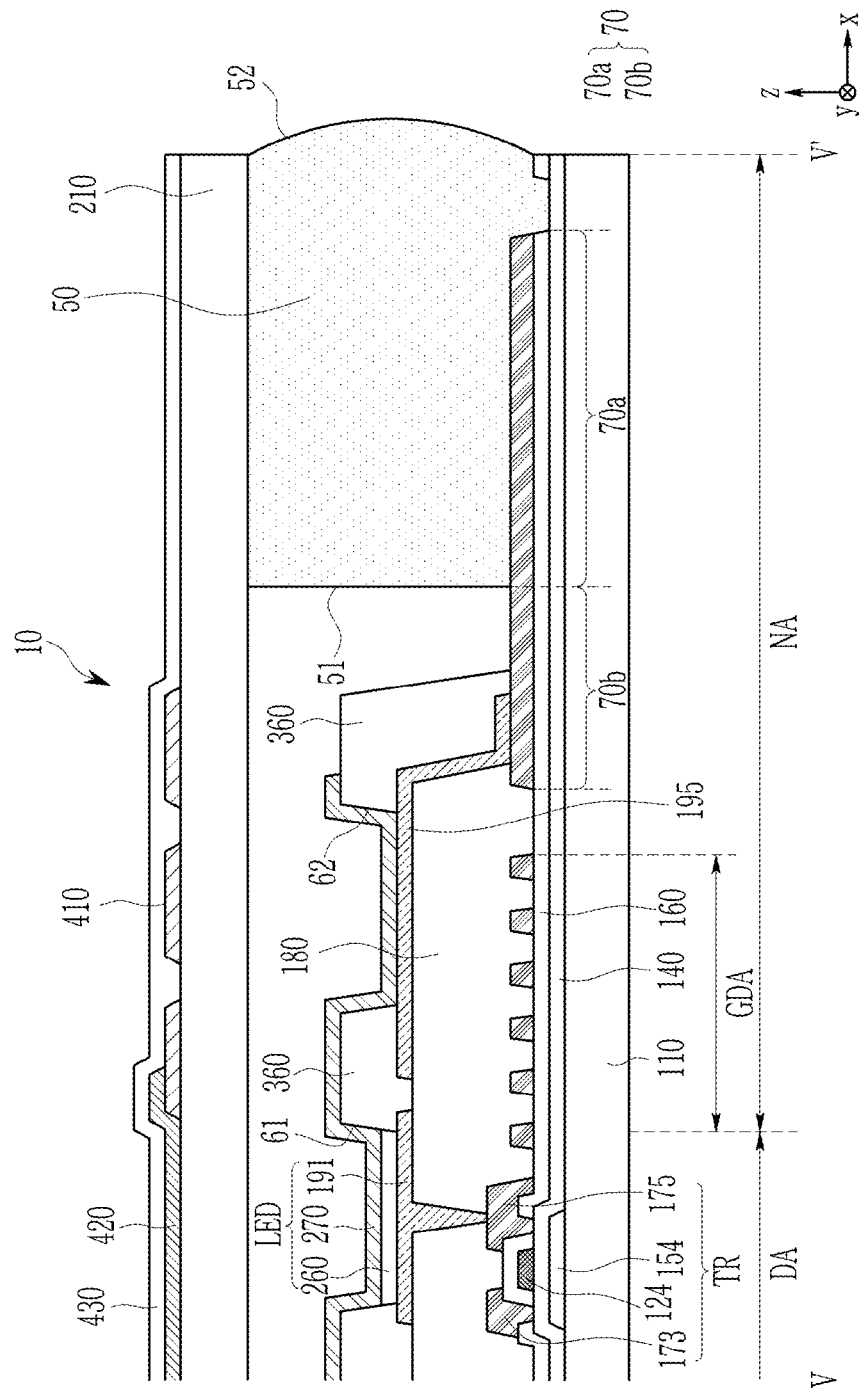
FIG. 5 is a cross-sectional view taken along a line V-V' in FIG. 1 according to an embodiment.
Figure 6:
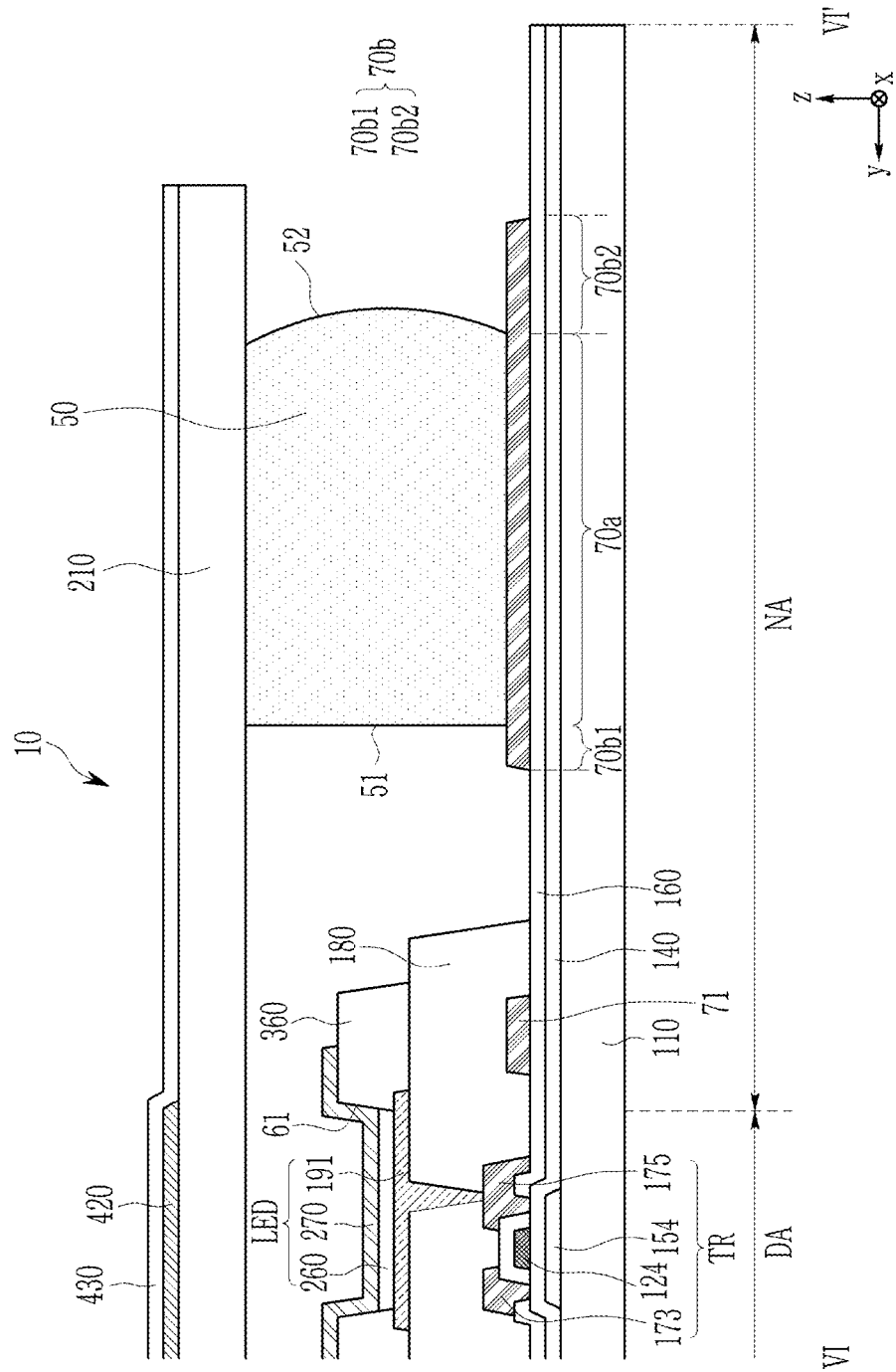
FIG. 6 is a cross-sectional view taken along a line VI-VI' in FIG. 1 according to an embodiment.

FIG. 5 is a cross-sectional view taken along a line V-V' in FIG. 1 according to an embodiment; and FIG. 6 is a cross-sectional view taken along a line VI-VI' in FIG. 1 according to an embodiment.

Referring to FIG. 5 and FIG. 6, the first substrate 110 may be an insulation substrate made of glass, quartz, ceramic, or the like. The first substrate 110 may be optically transparent or opaque.

A semiconductor layer 154 of a transistor may be disposed on the first substrate 110. The semiconductor layer 154 may include a channel region, and a source region and a drain region disposed on respective sides of the channel region. In an embodiment, the semiconductor layer 154 may include polysilicon, amorphous silicon, or an oxide semiconductor.

A buffer layer may be interposed between the first substrate 110 and the semiconductor layer 154 to prevent or substantially prevent diffusion of impurities degrading characteristics of the semiconductor layer 154 and prevent or substantially prevent penetration of moisture. A light blocking electrode may be disposed between the first substrate 110 and the semiconductor layer 154. The light blocking electrode prevents or substantially prevents external light from reaching the semiconductor layer 154, thereby blocking the characteristic deterioration of the semiconductor layer 154 and minimizing or reducing a leakage current of the transistor.

A first insulating layer 140 may be disposed on the semiconductor layer 154. The first insulating layer 140 may be referred to as a gate insulating layer. The first insulating layer 140 may include an inorganic insulating material, such as a silicon oxide ($SiO_x$), a silicon nitride ($SiN_x$), and the like.

A gate conductor that may include a gate electrode 124 of a transistor TR, a gate line, and the like may be disposed on the first insulating layer 140. The gate electrode 124 may overlap the channel region of the semiconductor layer 154. The gate conductor may include a metal, such as molybdenum (Mo), copper (Cu), aluminum (Al), silver (Ag), chromium (Cr), and tantalum (Ta), or a metal alloy thereof, and may be formed as a single layer or a multi-layer.

A second insulating layer 160 including an inorganic insulating material may be disposed on the gate conductor. The second insulating layer 160 may be referred to as an interlayer insulating layer.

On the second insulating layer 160, a data conductor that may include a source electrode 173 and a drain electrode 175 of the transistor TR, a data line, a driving voltage line, a common voltage transmitting line 70, a driving voltage transmitting line 71, and the like may be disposed. In an embodiment, the data conductor may be formed of a same material in a same process. In further detail, a conductive layer may be formed on the second insulating layer 160 and patterned through a photolithography process, thereby forming the source electrode 173, the drain electrode 175, the common voltage transmitting line 70, the driving voltage transmitting line 71, the data line, the driving voltage line, and the like. The common voltage transmitting line 70 and the driving voltage transmitting line 71 correspond to a power voltage transmitting line because they transmit the common voltage (ELVSS) and the driving voltage (ELVDD), respectively.

The common voltage transmitting line 70 may include the first portion 70a overlapping the sealant 50 and the second portion 70b that does not overlap the sealant 50. The second portion 70b may not be covered by the sealant 50. In an embodiment, in the left end part, the right end part, and the upper end part of the display device 10, the second portion 70b may be disposed further inside than the sealant 50. In an embodiment, in the lower end part of the display device 10, the second portion 70b may include the first protrusion 70b1 disposed further inside than the sealant 50 and the second protrusion 70b2 disposed further outside than the sealant 50.

The data conductor may include a metal, such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), a metal alloy thereof, and the like, and may be formed of the single layer or the multi-layer (e.g., Ti/Al/Ti, Mo/Al/Mo, Mo/Cu/Mo, etc.). The common voltage transmitting line 70 and/or the driving voltage transmitting line 71 may be formed of a conductor disposed in a different layer from the data conductor such as the gate conductor.

The source electrode 173 and the drain electrode 175 may be connected to the source region and the drain region of the semiconductor layer 154 through contact holes formed in the second insulating layer 160, respectively. The gate electrode 124, the source electrode 173, and the drain electrode 175 form the transistor TR together with the semiconductor layer 154. The transistor TR may be a driving transistor in the pixel PX of the emissive display device, or a transistor that is electrically connected to the driving transistor. In an embodiment, the transistor TR may be referred to as a top-gate transistor because the gate electrode 124 is disposed above the semiconductor layer 154. However, the structure of the transistor TR may be varied. In an embodiment, the transistor TR may be a bottom-gate transistor in which the gate electrode is disposed under the semiconductor, or may be a vertical transistor in which the source electrode and the drain electrode are overlapped.

A third insulating layer 180 may be disposed on the second insulating layer 160 and the data conductor. The third insulating layer 180 may be referred to as a polarization layer or a passivation layer. The third insulating layer 180 serves to planarize the interlayer insulating layer 160 by eliminating or reducing steps in order to increase the light emitting efficiency of the organic light emitting element to be formed thereon. The third insulating layer 180 may include an organic insulating material, such as a polyimide, a polyamide, a polyacrylate, a polyphenylene ether, a polyphenylene sulfide, an unsaturated polyester, an epoxy resin, a phenol resin, and the like. Although not shown in detail, in a driving unit region GDA adjacent to the display area DA, elements (e.g., a transistor, a capacitor, etc.) and wires configuring a driving unit such as a gate driver may be disposed between the first substrate 110 and the third insulating layer 180.

The third insulating layer 180 may be removed or absent in the non-display area NA adjacent to the sealant 50. Heat may also be applied or transmitted to the third insulating layer 180 when irradiating a laser for forming the sealant 50, and, in this case, a gas may be discharged from the third insulating layer 180. The discharged gas may cause shrinkage that reduces the emission region of the pixel PX by denaturing a light emission member 260. By removing the third insulating layer 180 in a region where it is possible to remove the third insulating layer 180, outgassing of the third insulating layer 180 may be minimized or reduced and the shrinkage may be prevented or substantially prevented.

A pixel electrode 191 and a connecting member 195 may be disposed on the third insulating layer 180. In an embodiment, the pixel electrode 191 and the connecting member 195 may be formed of a same material in a same process. In an embodiment, the pixel electrode 191 and the connecting member 195 may be formed by forming a conductive layer on the third insulating layer 180, and then patterning the conductive layer through a photolithography process. The pixel electrode 191 may be connected to the source electrode 173 or the drain electrode 175 of the transistor TR through a contact hole formed in the third insulating layer 180. The connecting member 195 may be connected to the common voltage transmitting line 70. The pixel electrode 191 and the connecting member 195 may be formed of a reflective conductive material, a transflective conductive material, or a transparent conductive material. The pixel electrode 191 and the connecting member 195 are made of a transparent conductive material, such as indium tin oxide (ITO) and indium zinc oxide (IZO), or a metal such as lithium (Li), calcium (Ca), aluminum (Al), silver (Ag), magnesium (Mg), and gold (Au).

A fourth insulating layer 360 may be disposed on the third insulating layer 180, the pixel electrode 191, and the connecting member 195. The fourth insulating layer 360 may be referred to as a pixel defining layer. The fourth insulating layer 360 may have an opening 61 overlapping the pixel electrode 191. The opening of the fourth insulating layer 360 may limit the region corresponding to the emission region of the pixel PX. The fourth insulating layer 360 may include an organic insulating material, such as a polyimide, a polyacrylate, or a polyamide. Similar to the third insulating layer 180, the fourth insulating layer 360 may be removed or absent from the non-display area NA adjacent to the sealant 50 to prevent or substantially prevent the shrinkage by the outgassing.

The light emission member 260 may be disposed on the pixel electrode 191.

The light emission member 260 may include a first organic common layer, an emission layer, and a second organic common layer, which are sequentially stacked. The first organic common layer may include at least one of a hole injection layer and a hole transferring layer. The emission layer may include an organic material uniquely representing light of a primary color such as red, green, and blue, and having a structure in which organic material layers representing light of different colors from each other are stacked. The second organic common layer may include at least one of an electron transferring layer and an electron injection layer.

A common electrode 270 transmitting the common voltage (ELVSS) may be disposed on the light emission member 260. The common electrode 270 may include a transparent conductive material, such as indium tin oxide (ITO) and indium zinc oxide (IZO). In an embodiment, the common electrode 270 may formed by thinly laminating metals, such as calcium (Ca), barium (Ba), magnesium (Mg), aluminum (Al), and silver (Ag) to have a light transmitting property. The common electrode 270 may be connected to the connecting member 195 through a contact hole 62 formed in the fourth insulating layer 360. Since the connecting member 195 is connected to the common voltage transmitting line 70, the common electrode 270 may be electrically connected to the common voltage transmitting line 70 through the connecting member 195 and may receive the common voltage (ELVSS) from the common voltage transmitting line 70. In an embodiment, the display device 10 may not include the connecting member 195, and the common electrode 270 may be connected directly to the common voltage transmitting line 70. In an embodiment, at least one protective layer or functional layer may be disposed on the common electrode 270.

The pixel electrode 191, the light emission member 260, and the common electrode 270 of each pixel PX form a light emitting element LED of a light emitting diode. The pixel electrode 191 may be an anode which is a hole injection electrode and the common electrode 270 may be a cathode which is an electron injection electrode, or vice versa. Holes and electrons are injected into the light emission member 260 from the pixel electrode 191 and the common electrode 270, respectively, and exitons generated by coupling of the injected holes and electrons fall from an excited state to a ground state to emit light The second substrate 210 facing the first substrate 110 may be an insulating substrate made of glass, quartz, ceramic, or the like, and may be optically transparent. The second substrate 210 may be bonded to the first substrate 110 by the sealant 50.

In an embodiment, a touch sensor layer including a touch signal line 410 and a touch electrode 420 may be disposed on the second substrate 210. The touch sensor layer may be used to detect a contact and/or non-contact touch of a user. The touch signal line 410 may be disposed in the non-display area NA and the touch electrode 420 may be disposed in the display area DA. The touch signal line 410 may be formed of a metal or a metal alloy, and the touch electrode 420 may be formed of a transparent conductive material, a metal mesh, or a conductive polymer. In an embodiment, a protection layer 430 such as an insulating layer may be disposed on the touch signal line 410 and the touch electrode 420. The touch electrode 420 may be positioned on the touch signal line 410 or vice versa, and the touch signal line 410 and the touch electrode 420 may be disposed on a same layer. The touch signal line 410 and the touch electrode 420 may be disposed on the inner surface of the second substrate 210 (i.e., the surface facing the first substrate 110), or may be formed on a separate substrate and attached to the second substrate 210.

The sealant 50 that seals the display device 10 air-tightly while bonding the first substrate 110 and the second substrate 210 may be positioned between the first substrate 110 and the second substrate 210. The sealant 50 may include an inner surface 51 facing the display area DA and an outer surface 52 facing the outside of the display device 10. When the display device 10 is quadrangular or approximately quadrangular, the inner surface 51 of the sealant 50 may be the quadrangular or approximately quadrangular on a plane, and four corners may be curved. The outer surface 52 of the sealant 50 may be aligned or approximately aligned with the edge of the first substrate 110 and the second substrate 210. In an embodiment, the outer surface 52 of the sealant 50 may be formed to be protruded from the edge of the first substrate 110 and the second substrate 210. In this case, a risk of damage to the edges of the first substrate 110 and the second substrate 210 due to an impact or the like may be reduced.

In an embodiment, the sealant 50 may be formed by coating a sealing material on the second substrate 210 or the first substrate 110, disposing the first substrate 110 or the second substrate 210 to the sealing material between the first substrate 110 and the second substrate 210, and irradiating a laser to the place where the sealing material is coated. In an embodiment, the coated sealing material may be a frit such as a glass frit. When the sealing material is heated by laser irradiation, the sealing material may be melted and adhered to the first substrate 110 and the second substrate 210, and the sealant may be cured in the adhered state, thereby forming the sealant 50 air-tightly bonding the first substrate 110 and the second substrate 210. The laser may be irradiated toward the sealing material on the second substrate 210. In an embodiment, the sealing material may be heated by the laser to a temperature of 300° C.

When forming the sealant 50, the first portion 70a of the common voltage transmitting line 70 overlapping the sealant 50 may be damaged. Specifically, a phase transformation in which the first portion 70a is melted at least partially and then hardened may be caused by latent heat of the sealing material, thereby increasing the resistance of the first portion 70a. However, the second portion 70b of the common voltage transmitting line 70, which does not overlap with the sealant 50, is unaffected or hardly affected by the latent heat of the sealing material such that it may not be damaged or have increased resistance. Accordingly, to reduce the width of the non-display area NA, even if the resistance of the first portion 70a is increased by disposing the common voltage transmitting line 70 to overlap the sealant 50, a certain resistance (e.g., a predetermined resistance) of the common voltage transmitting line 70 may be obtained by the second portion 70b that does not overlap the sealant 50.

Figure 7:
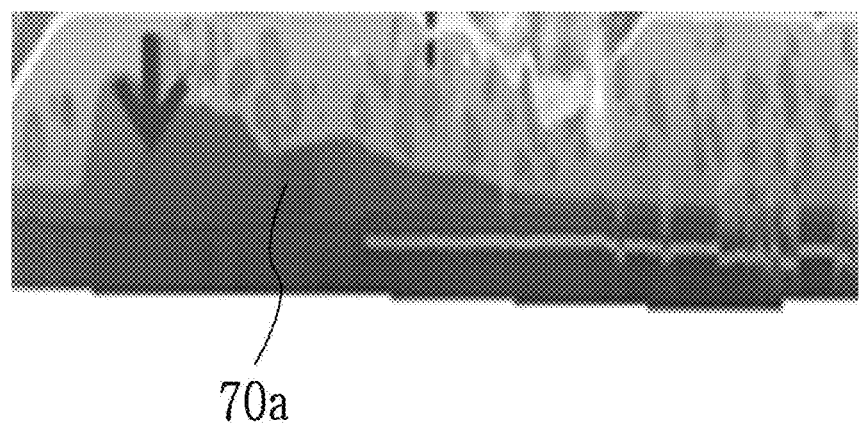
FIG. 7 is a cross-sectional photograph of a region where a common voltage transmitting line overlaps a sealant.
Figure 8:
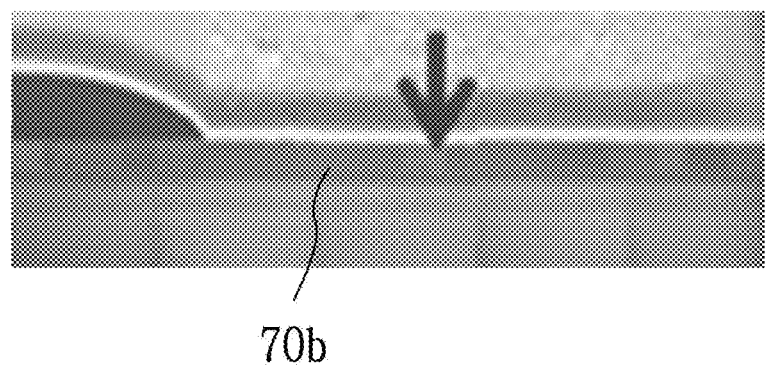
FIG. 8 is a cross-sectional photograph of a region where a common voltage transmitting line does not overlap a sealant.

Referring to FIG. 7, which is a cross-sectional photograph of the first portion 70a of the common voltage transmitting line 70, it may be confirmed that the thickness of the first portion 70a is not uniform. This shows that the first portion 70a is phase-transformed by thermal energy during the formation of the sealant 50. The thickness non-uniformity may increase the resistance of the first portion 70a. By contrast, referring to FIG. 8, which is a cross-sectional photograph of the second portion 70b of the common voltage transmitting line 70, it may be confirmed that the thickness of the second portion 70b is uniform. This shows that the second portion 70b does not undergo phase transformation and remains in the initially formed state in the formation of the sealant 50.

The first portion 70a of the common voltage transmitting line 70 may serve as a reflective layer to enhance utilization efficiency of the irradiated laser when forming the sealant 50. The top surface of the first portion 70a may be in contact with the sealant 50. In the first portion 70a, openings, such as a slit, may be formed to increase the adhesion by increasing the contact area of the lower end part of the sealant 50. In an embodiment, in the left end part, the right end part, and the upper end part of the display device 10, the connecting member 195 may be in contact with and connected to at least the second portion 70b of the common voltage transmitting line 70.

An embodiment in which the common voltage transmitting line 70 is formed of the different conductor from the data conductor is now described with reference to FIG. 9 and FIG. 10.

Figure 9:
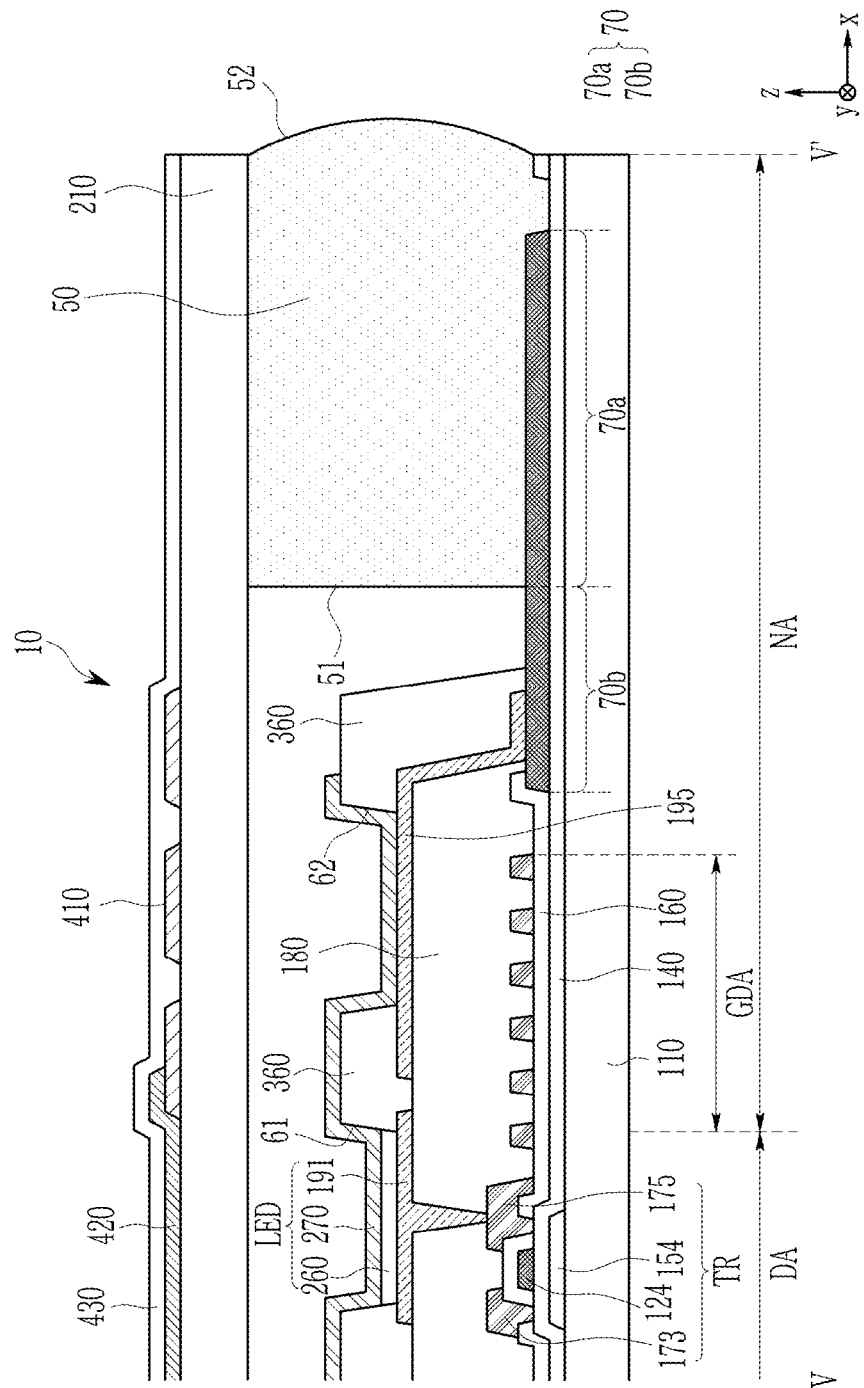
FIG. 9 is a cross-sectional view taken along a line V-V' in FIG. 1 according to an embodiment.
Figure 10:
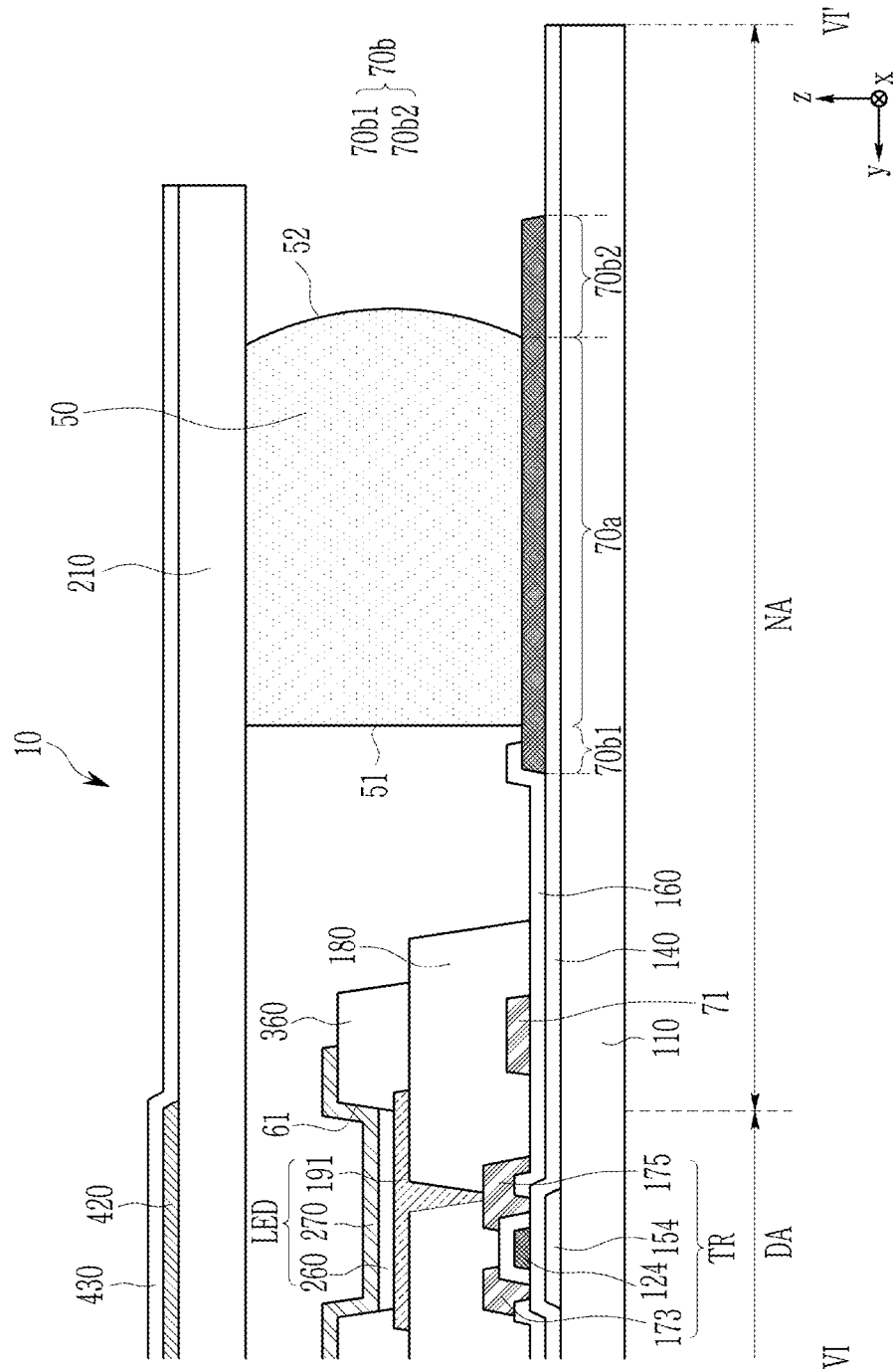
FIG. 10 is a cross-sectional view taken along a line VI-VI' in FIG. 1 according to an embodiment.

FIG. 9 is a cross-sectional view taken along a line V-V' in FIG. 1 according to an embodiment; and FIG. 10 is a cross-sectional view taken along a line VI-VI' in FIG. 1 according to an embodiment.

Referring to FIG. 9 and FIG. 10, the common voltage transmitting line 70 may be formed of the gate conductor. That is, the common voltage transmitting line 70 may be disposed on a same layer as the gate electrode 124 of the transistor TR, and the lower surface of the common voltage transmitting line 70 may be in contact with the upper surface of the first insulating layer 140. In an embodiment, the common voltage transmitting line 70 may be formed with the gate electrode 124 by patterning the conductive layer through a photolithography process after forming the conductive layer on the first insulating layer 140.

Next, a display device that may further include a color conversion panel 20 and an encapsulation layer 390 is described with reference to FIG. 11.

Figure 11:
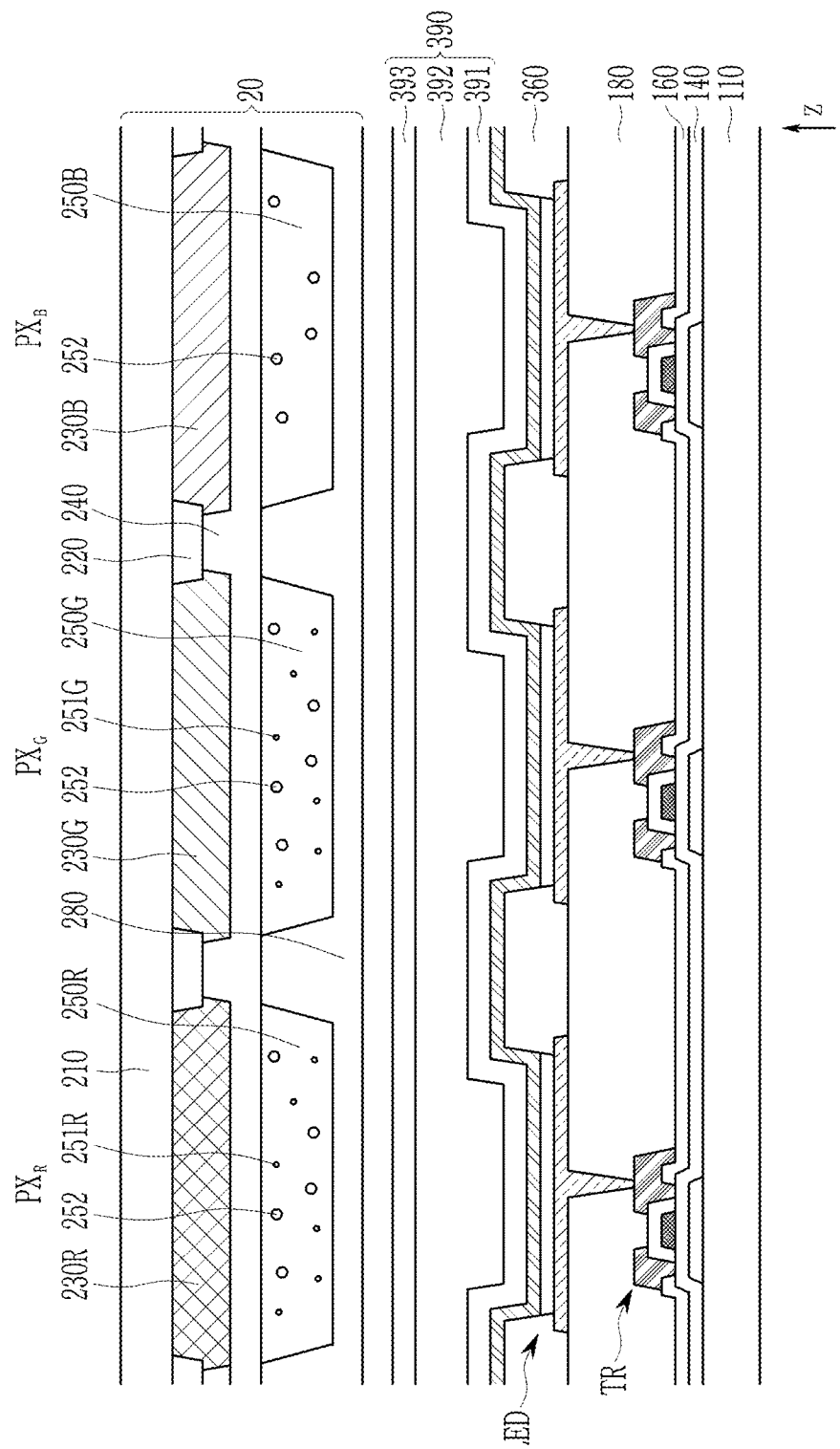
FIG. 11 is a schematic cross-sectional view of a display device according to an embodiment.

FIG. 11 is a schematic cross-sectional view of a display device according to an embodiment. FIG. 11 shows the cross-sectional structure of a region that may correspond to three pixels $PX_R$, $PX_G$, and $PX_B$ among the display area of the display device.

The display device may include the substrate 110, and the transistors TR, the light emitting elements LED, and the insulating layers 140, 160, 180, and 360 disposed thereon. In an embodiment, the structure of the transistors TR and the light emitting elements LED may be the same as described above. In an embodiment, each light emitting element LED may emit blue light.

The encapsulation layer 390 may be disposed on the light emitting elements LED. The encapsulation layer 390 encapsulates the light emitting elements LED to prevent or substantially prevent moisture or oxygen from penetrating from the outside. In an embodiment, the encapsulation layer 390 may be a thin film encapsulation layer including at least one inorganic layer and at least one organic layer. In an embodiment, the encapsulation layer 390 may include a first inorganic layer 391, an organic layer 392, and a second inorganic layer 393. The first inorganic layer 391 and the second inorganic layer 393 may prevent or substantially prevent penetration of moisture, and the organic layer 392 may flatten the surface of the encapsulation layer 390, that is, the surface of the second inorganic layer 393.

In an embodiment, a capping layer and a functional layer may be disposed between the light emitting elements LED and the encapsulation layer 390, The capping layer may have a function of improving optical efficiency of the display device by adjusting the refractive index. The functional layer may have a function of preventing or substantially preventing damage to the underlying layers during the formation of the encapsulation layer 390 and increasing the optical efficiency.

The color conversion panel 20 may be disposed on the encapsulation layer 390. The color conversion panel 20 may be bonded to the first substrate 110 by the sealant. The color conversion panel 20 may be attached to the encapsulation layer 390 by the adhesive layer.

The color conversion panel 20 may include a second substrate 210, and a light blocking member 220, color filters 230R, 230G, and 230B, color conversion layers 250R and 250G, and a transmissive layer 250B, which are disposed on the second substrate 210. The light blocking member 220, the color filters 230R, 230G, and 230B, the color conversion layers 250R and 250G, and the transmissive layer 250B may be disposed on the surface of the second substrate 210 facing the first substrate 110.

The color filters 230R, 230G, and 230B may include a red color filter 230R, a green color filter 230G, and a blue color filter 230B. The red color filter 230R, the green color filter 230G, and the blue color filter 230B may correspond to a red pixel $PX_R$, a green pixel $PX_G$, and a blue pixel $PX_B$, respectively.

The light blocking member 220 encloses or surrounds the red color filter 230R, the green color filter 230G, and the blue color filter 230B. The light blocking member 220 may prevent or substantially prevent light of different colors emitted from the neighboring pixels $PX_R$, $PX_G$, and $PX_B$ from being mixed. The light blocking member 220 may divide regions where the red color filter 230R, the green color filter 230G, and the blue color filter 230B are disposed.

A first planarization layer 240 covering the color filters 230R, 230G, and 230B may be disposed on the second substrate 210. The first planarization layer 240 may include an organic insulating material and/or an inorganic insulating material.

The color conversion layers 250R and 250G and the transmissive layer 250B may be disposed on the surface of the first planarization layer 240 facing the first substrate 110. The color conversion layers 250R and 250G may convert and emit wavelengths of light incident from the light emitting element LED. The transmissive layer 250B may emit the wavelength of the light incident from the light emitting element LED without conversion. The color conversion layers 250R and 250G may include a red color conversion layer 250R and a green color conversion layer 250G. The red color conversion layer 250R, the green color conversion layer 250G, and the transmissive layer 250B may overlap the red color filter 230R, the green color filter 230G, and the blue color filter 230B, respectively.

In an embodiment, the red color conversion layer 250R may include a first semiconductor nanocrystal 251R that converts blue light incident from the light emitting element LED to red light. The first semiconductor nanocrystal 251R may include a quantum dot and/or a phosphor. The green color conversion layer 250G may include a second semiconductor nanocrystal 251G that converts blue light incident from the light emitting element LED to green light. The second semiconductor nanocrystal 251G may include a phosphor and/or a quantum dot. The transmissive layer 250B may include a resin that transmits blue light. In an embodiment, to reduce external light reflection and improve a color purity of blue light, the transmissive layer 250B may include a dye and/or pigment.

The red color conversion layer 250R, the green color conversion layer 250G, and/or the transmissive layer 250B may include a scatterer 252. The scatterer 252 may increase the amount of emitted light that is converted or passed through the color conversion layers 250R and 250G and the transmissive layer 250B, and may make the front luminance and the lateral luminance uniform.

A second planarization layer 280 covering the color conversion layers 250R and 250G and the transmissive layer 250B may be disposed on the second substrate 210. The second planarization layer 280 may include an organic insulating material and/or an inorganic insulating material.

The color conversion panel 20 may include a blue light blocking filter (e.g., a yellow color filter) that transmits a wavelength except for the blue wavelength band and blocks the blue wavelength band between the red color filter 230R and the green color filter 230G, and the second substrate 210.

While the inventive concept has been described in connection with what are presently considered to be some practical embodiments, it is to be understood that the inventive concept is not limited to the disclosed embodiments, but, on the contrary, is intended to cover various modifications and equivalent arrangements included within the spirit and scope of the appended claims.

What is claimed is:

1. A display device comprising:
   a first substrate comprising a display area and a non-display area around the display area;
   a pad portion at an end part of the first substrate in the non-display area;
   a power voltage transmitting line electrically connected to the pad portion and surrounding at least part of the display area;
   a second substrate facing the first substrate and not overlapping the pad portion; and
   a sealant between the first substrate and the second substrate and surrounding the display area,
   wherein, in the end part, the power voltage transmitting line comprises a first portion overlapping the sealant and extending in a first direction, and a second portion not overlapping the sealant,
   the second portion comprises a first protrusion protruded from the first portion in a second direction crossing the first direction, and a second protrusion protruded in a direction opposite to the second direction, and
   the first protrusion and the second protrusion each extend in the first direction, and the first protrusion and the second protrusion each have a length in the first direction that is larger than a width in the second direction.

2. The display device of claim 1, wherein the first protrusion and the second protrusion comprise a part that does not overlap the pad portion in the second direction.

3. The display device of claim 2, wherein the power voltage transmitting line further comprises a third part extending from the end part in the second direction and connected to at least one pad of the pad portion.

4. The display device of claim 1, wherein at least one of the first protrusion and the second protrusion comprises a part of which a width varies along the first direction.

5. The display device of claim 4, wherein the second protrusion comprises a part of which a width decreases along the first direction and then increases.

6. The display device of claim 1, wherein the first portion has a non-uniform thickness, and the second portion has a uniform thickness.

7. The display device of claim 1, further comprising a light emitting element disposed in the display area, and
the power voltage transmitting line is a common voltage transmitting line that is electrically connected to a common electrode of the light emitting element.

8. The display device of claim 7, further comprising a transistor in the display area and connected to a pixel electrode of the light emitting element, and
the common voltage transmitting line is arranged as a same layer as source and drain electrodes of the transistor.

9. The display device of claim 7, further comprising a transistor in the display area and connected to a pixel electrode of the light emitting element, and
the common voltage transmitting line is arranged as a same layer as a gate electrode of the transistor.

* * * * *